(12) United States Patent
Liao et al.

(10) Patent No.: US 11,973,450 B2
(45) Date of Patent: Apr. 30, 2024

(54) CURRENT DETECTION CIRCUIT AND GARBAGE CAN

(71) Applicant: Jiangmen Jinlong High Technology Industrial Co., Ltd., Guangdong (CN)

(72) Inventors: Jinsheng Liao, Guangdong (CN); Weitang Lu, Guangdong (CN)

(73) Assignee: Jiangmen Jinlong High Technology Industrial Co., Ltd., Jiangmen (CN)

( * ) Notice: Subject to any disclaimer, the term of this patent is extended or adjusted under 35 U.S.C. 154(b) by 183 days.

(21) Appl. No.: 17/690,156

(22) Filed: Mar. 9, 2022

(65) Prior Publication Data

US 2022/0329196 A1    Oct. 13, 2022

(30) Foreign Application Priority Data

Apr. 13, 2021   (CN) .......................... 202120755749.2
Jul. 1, 2021    (CN) .......................... 202121494007.5

(51) Int. Cl.
*H02P 29/40*    (2016.01)
*B65F 1/16*     (2006.01)
(Continued)

(52) U.S. Cl.
CPC ............ *H02P 29/40* (2016.02); *B65F 1/1638* (2013.01); *H01L 27/0629* (2013.01); *H01L 27/088* (2013.01)

(58) Field of Classification Search
CPC .... H02P 29/40; B65F 1/1638; H01L 27/0629; H01L 27/088
See application file for complete search history.

(56) References Cited

U.S. PATENT DOCUMENTS 4,581,565 A      4/1986    Van Pelt et al.
2003/0201268 A1  10/2003   Lin
(Continued)

FOREIGN PATENT DOCUMENTS

CN     201849883 U    6/2011
CN     102361423 A    2/2012
(Continued)

OTHER PUBLICATIONS

International Search Report dated Jan. 18, 2022, issued in counterpart International application No. PCT/CN2021/108518, with English translation. (5 pages).
(Continued)

*Primary Examiner* — Zoheb S Imtiaz
(74) *Attorney, Agent, or Firm* — WHDA, LLP

(57) ABSTRACT

Disclosed are a current detection circuit and a garbage can. The current detection circuit may include: a first switching device for being connected with a first current driving end of the direct current motor; a second switching device for being connected with a second current driving end of the direct current motor; a third switching device for being connected with the second current driving end of the direct current motor; a fourth switching device for being connected with the first current driving end of the direct current motor; a control chip, the first switching device, the second switching device, the third switching device and the fourth switching device are all electrically connected with the control chip; and a current detection module, the control chip is connected to a detection output end of the current detection module.

9 Claims, 5 Drawing Sheets

(51) Int. Cl.
*H01L 27/06* (2006.01)
*H01L 27/088* (2006.01)

(56) References Cited

U.S. PATENT DOCUMENTS

| | | | | |
|---|---|---|---|---|
| 2005/0005785 A1* | 1/2005 | Poss | ............... | B65F 1/1607 |
| | | | | 100/240 |
| 2014/0368139 A1* | 12/2014 | Zhou | ............... | H02P 6/15 |
| | | | | 318/400.35 |
| 2016/0043667 A1* | 2/2016 | Aiura | ............... | H02P 3/14 |
| | | | | 318/376 |

FOREIGN PATENT DOCUMENTS

| | | |
|---|---|---|
| CN | 202261119 U | 5/2012 |
| CN | 202575148 U | 12/2012 |
| CN | 204517703 U | 7/2015 |
| CN | 204606765 U | 9/2015 |
| CN | 204606804 U | 9/2015 |
| CN | 204761334 U | 11/2015 |
| CN | 206088011 U | 4/2017 |
| CN | 206283437 U | 6/2017 |
| CN | 207827099 U | 9/2018 |
| CN | 208531356 U | 2/2019 |
| CN | 110112966 A | 8/2019 |
| CN | 209805709 U | 12/2019 |

OTHER PUBLICATIONS

Written Opinion dated Jan. 18, 2022, issued in counterpart International application No. PCT/JP2021/108518, with English translation. (5 pages).

International Search Report dated Mar. 28, 2022, issued in counterpart International application No. PCT/CN2021/108519, with English translation. (6 pages).

Written Opinion dated Mar. 28, 2022, issued in counterpart International application No. PCT/CN2021/108519, with English translation. (5 pages).

* cited by examiner

CURRENT DETECTION CIRCUIT AND GARBAGE CAN

CROSS-REFERENCE TO RELATED APPLICATIONS

This application is filed on the basis of Chinese application No. 202121494007.5 filed Jul. 1, 2021, and Chinese application No. 202120755749.2 filed Apr. 13, 2021, and claims priority to these applications, the entire contents of Which are incorporated herein by reference.

TECHNICAL FIELD

The present disclosure relates to the field of circuit detection, and more particularly, to a current detection circuit and control method, and a garbage can.

BACKGROUND

With the continuous development of social economy and science and technology, smart garbage cans have been more and more used in people's daily life. Reasonable cooperation of motor selection, circuit hardware and control mode makes a product run smoothly. At present control circuits and modes that usually use the forward rotation and reverse rotation of a motor to control the opening and closing of a trash cover are complicated and diverse, and the opening and closing of the motor after loading by forward rotation and reverse rotation cannot be flexibly adjusted to make the opening and closing move smoothly, and a current of the motor cannot be flexibly adjusted through the circuit at lower cost to achieve the effect of current reducing.

SUMMARY

The present disclosure aims at solving at least one of the technical problems in the prior art Therefore, the present disclosure provides a current detection circuit and control method, and a garbage can, which can control a duty ratio of the motor to realize current change (the duty ratio is a change ratio designed by an on-off duration of the motor), control the current change to realize smooth opening and closing, achieve acceleration or deceleration effects through the design of the duty ratio, and feed back the current change to the detection circuit at the same time, judge whether a cover is opened and closed in place and whether obstacles are encountered in the opening and closing process to make the motor stop or continue to move, so that a linear change of the opening and closing of direct current motor can be conveniently and quickly controlled to achieve a smooth effect, the numerical adjustment of the duty ratio reaches a certain ideal value, the efficiency of the motor is optimum, and the current is least, so that the motor can automatically adjust the duty ratio in different states in a way similar to that of step-down and voltage-stabilizing circuits, so that the control process is simpler and faster, and an ideal rotation speed of the motor after loading can be flexibly adjusted.

The present disclosure provides an optimized key implementation point. 1. The current change is fed back to the detection circuit to judge whether the cover is opened and closed in place and whether the motor stops or needs to continue to move due to the obstacles encountered in the opening and closing process. This design is realized by several times of continuous detections in a short time, while preventing the motor from gear explosion. 2. The best regulation effect is realized by cooperating to increase the rotation speed and output torque of the motor at no-load to a certain ratio on the basis of current detection hardware and reserving a motor allowance.

A current detection circuit of an embodiment according to a first aspect of the present disclosure is used for controlling forward and reverse rotation of a direct current motor, comprising:
  a first switching device for being connected with a first current driving end of the direct current motor:
  a second switching device for being connected with a second current driving end of the direct current motor;
  a third switching device for being connected with the second current driving end of the direct current motor;
  a fourth switching device for being connected with the first current driving end of the direct current motor;
  a control chip, wherein the first switching device, the second switching device, the third switching device and the fourth switching device are all electrically connected with the control chip; and
  a current detection module, wherein the second switching device and the third switching device are both connected to a detection input end of the current detection, module, and the control chip is connected to a detection output end of the current detection module;
  wherein, in response to a first signal sent by the control chip, the first switching device and the third switching device are switched on to make the direct current motor rotate forwardly; and in response to a second signal sent by the control chip, the second switching device and the fourth switching device are switched on to make the direct current motor rotate reversely.

The current detection circuit according to the embodiments of the present disclosure at least has the following beneficial effects. The first switching device, the second switching device, the third switching device and the fourth switching device are all controlled by the control chip; when the control chip controls the first switching device and the third switching device to be switched on, a current can enter from the first current driving end of the direct current motor and be output from the second current driving end of the direct current motor, so that the direct current motor rotates forwardly; when the control chip controls the second switching device and the fourth switching device to be switched on, the current can enter from the second current driving end of the direct current motor and be output from the first current driving end of the direct current motor, so that the direct current motor rotates reversely; moreover, the current detection module can also detect a current value during the forward and reverse rotation of the direct current motor, so that the control chip can achieve the effect of controlling a running status of the direct current motor by controlling the first switching device, the second switching device, the third switching device and the fourth switching device based on the detected current value. Through the foregoing technical solution, by controlling the flow direction of the current and detecting the current, the direct current motor can be conveniently and quickly controlled to rotate forwardly and reversely, so that the control process is simpler and faster.

According to some embodiments of the present disclosure, the first switching device comprises a first P-type field effect transistor, a first triode, a first resistor, a fifth resistor and a seventh resistor, one end of the seventh resistor is connected with a first control end of the control chip, the other end of the seventh resistor is connected with a base of the first triode, an emitter of the first triode is connected with a reference ground, a collector of the first triode is connected fifth one end of the fifth resistor, the other end of the fifth resistor and one end of the first resistor are both connected with a gate of the first P-type field effect transistor, the other end of the first resistor and a source of the first P-type field effect transistor are both connected with a positive pole of a power supply, and a drain of the first P-type field effect transistor is connected with the first current driving end of the direct current motor.

According to some embodiments of the present disclosure, the third switching device comprises a first N-type field effect transistor and a fourth resistor, a drain of the first N-type field effect transistor is connected with the second current driving end of the direct current motor, one end of the fourth resistor is connected with a second control end of the control chip, the other end of the fourth resistor is connected with a gate of the first. N-type field effect transistor, and a source of the first N-type field effect transistor is connected with the reference ground.

According to some embodiments of the present disclosure, the second switching device comprises a second P-type field effect transistor, a second triode, a second resistor, a sixth resistor and an eighth resistor, one end of the eighth resistor is connected with a third control end of the control chip, the other end of the eighth resistor is connected with a base of the second triode, an emitter of the second triode is connected with the reference ground, a collector of the second triode is connected with one end of the sixth resistor, the other end of the sixth resistor and one end of the second resistor are both connected with a gate of the second P-type field effect transistor, the other end of the second resistor and a source of the second P-type field effect transistor are both connected with the positive pole of the power supply, and a drain of the second P-type field effect transistor is connected with the second current driving end of the direct current motor.

According to some embodiments of the present disclosure, the fourth switching device comprises a second N-type field effect transistor and a third resistor, a drain of the second N-type field effect transistor is connected with the first current driving end of the direct current motor one end of the third resistor is connected with a fourth control end of the control chip, the other end of the third resistor is connected with a gate of the second N-type field effect transistor, and a source of the second N-type field effect transistor is connected with the reference ground.

According to some embodiments of the present disclosure, the current detection module comprises a ninth resistor and a tenth resistor, the source of the first N-type field effect transistor and the source of the second N-type field effect transistor are both connected with one end of the tenth resistor, one end of the ninth resistor is connected with one end of the tenth resistor, the other end of the tenth resistor is connected with the reference ground, and the other end of the ninth resistor is connected with a current detection end of the control chip.

According to some embodiments of the present disclosure, a first magnetic bead is further comprised, wherein one end of the first magnetic bead is connected with the drain of the first P-type field effect transistor, and the other end of the first magnetic bead is connected with the first current driving end of the direct current motor.

According to some embodiments of the present disclosure, a second magnetic bead is further comprised, wherein one end of the second magnetic bead is connected with the drain of the first N-type field effect transistor, and the other end of the second magnetic: bead is connected with the second current driving end of the direct current motor.

According to some embodiments of the present disclosure, the current detection module further comprises a first capacitor, the other end of the ninth resistor is also connected with one end of the first capacitor, and the other end of the first capacitor is connected with the reference ground.

A garbage can of an embodiment according to a second aspect of the present disclosure comprises the current detection circuit according to the embodiment of the first aspect.

The garbage can of the embodiment according to the second aspect of the present disclosure at least has the following beneficial effects. The first switching device, the second switching device, the third switching device and the fourth switching device are all controlled by the control chip; when the control chip controls the first switching device and the third switching device to be switched on, a current can enter from the first current driving end of the direct current motor and be output from the second current driving end of the direct current motor so that the direct current motor rotates forwardly; when the control chip controls the second switching device and the fourth switching device to be switched on, the current can enter from the second current driving end of the direct current motor and be output from the first current driving end of the direct current motor, so that the direct current motor rotates reversely; moreover, the current detection module can also detect a current value during the forward and reverse rotation of the direct current motor, so that the control chip can achieve the effect of controlling a running status of the direct current motor by controlling the first switching device, the second switching device, the third switching device and the fourth switching device based on the detected current value. Through the foregoing technical solution, by controlling the flow direction of the current and detecting the current, the direct current motor can be conveniently and quickly controlled to rotate forwardly and reversely, so that the control process is simpler and faster. By using the current detection circuit above, the can cover can be opened and closed conveniently and quickly, so that the control process is simpler and faster.

Some additional aspects and advantages of the present disclosure will be given in part in the following description, and some will become obvious from the following description, or learned through the practice of the present disclosure.

BRIEF DESCRIPTION OF DRAWINGS

The above and/or additional aspects and advantages of the present disclosure will be more apparent from the following description of the embodiments in conjunction with the accompanying drawings, wherein.

DETAILED DESCRIPTION

Figure 1:
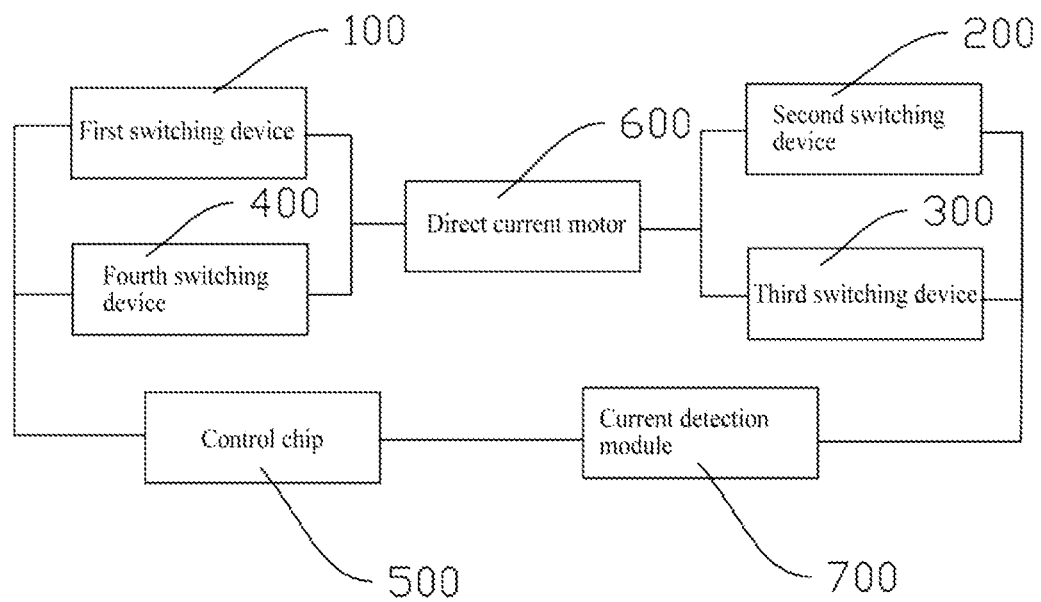
FIG. 1 is a circuit block diagram of a current detection circuit according to an embodiment of the present disclosure.

The embodiments of the present disclosure will be described in detail hereinafter. Examples of the embodiments are shown in the accompanying drawings. The same or similar reference numerals throughout the drawings denote the same or similar elements or elements having the same or similar functions. The embodiments described below with reference to the accompanying drawings are exemplary and are only intended to explain the present disclosure, but should not be construed as limiting the present disclosure.

In the description of the embodiments, it should be understood that the orientation or positional relationship indicated by the terms relating orientation description such as "upper", "lower", "right" and the like is based on the orientation or positional relationship shown in the drawings, only for the convenience of describing and simplifying the present disclosure, and does not indicate or imply that the indicated device or element must have a specific orientation, or be constructed and operated in a specific orientation. Therefore, the terms should not be construed as limiting the present disclosure.

In the description of the present disclosure, unless otherwise clearly defined, words such as setting, connection, and the like, shall be understood broadly, and those skilled in the art can reasonably determine the specific meanings of the above words in the present disclosure in combination with the specific contents of the technical solution.

Figure 2:
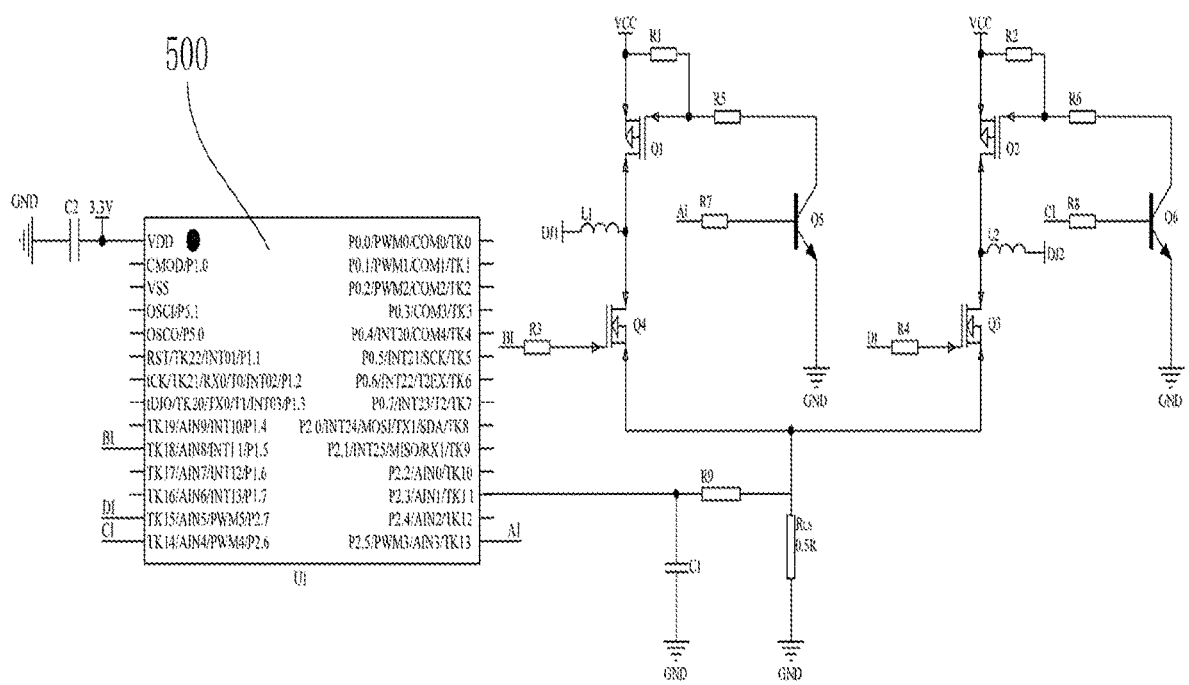
FIG. 2 is a schematic circuit diagram of the current detection circuit according to the embodiment of the present disclosure.
Figure 3:
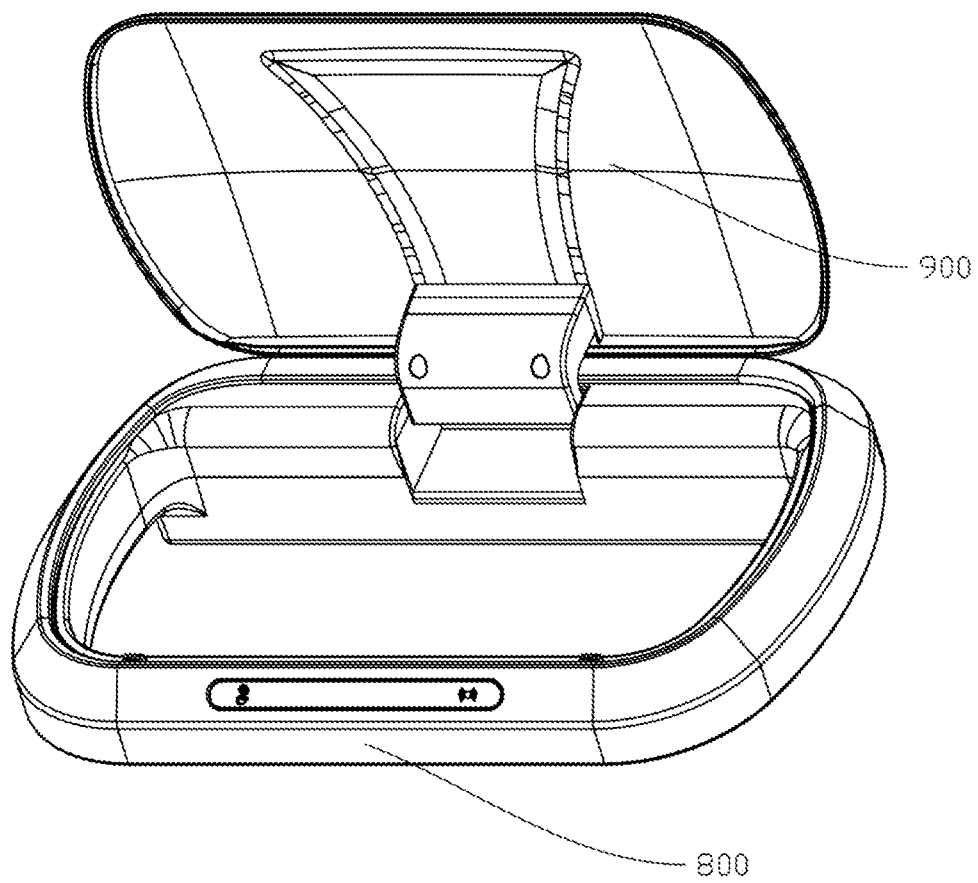
FIG. 3 is an overall schematic diagram of a can cover having a stabilizing device according to an embodiment of the present disclosure.
Figure 4:
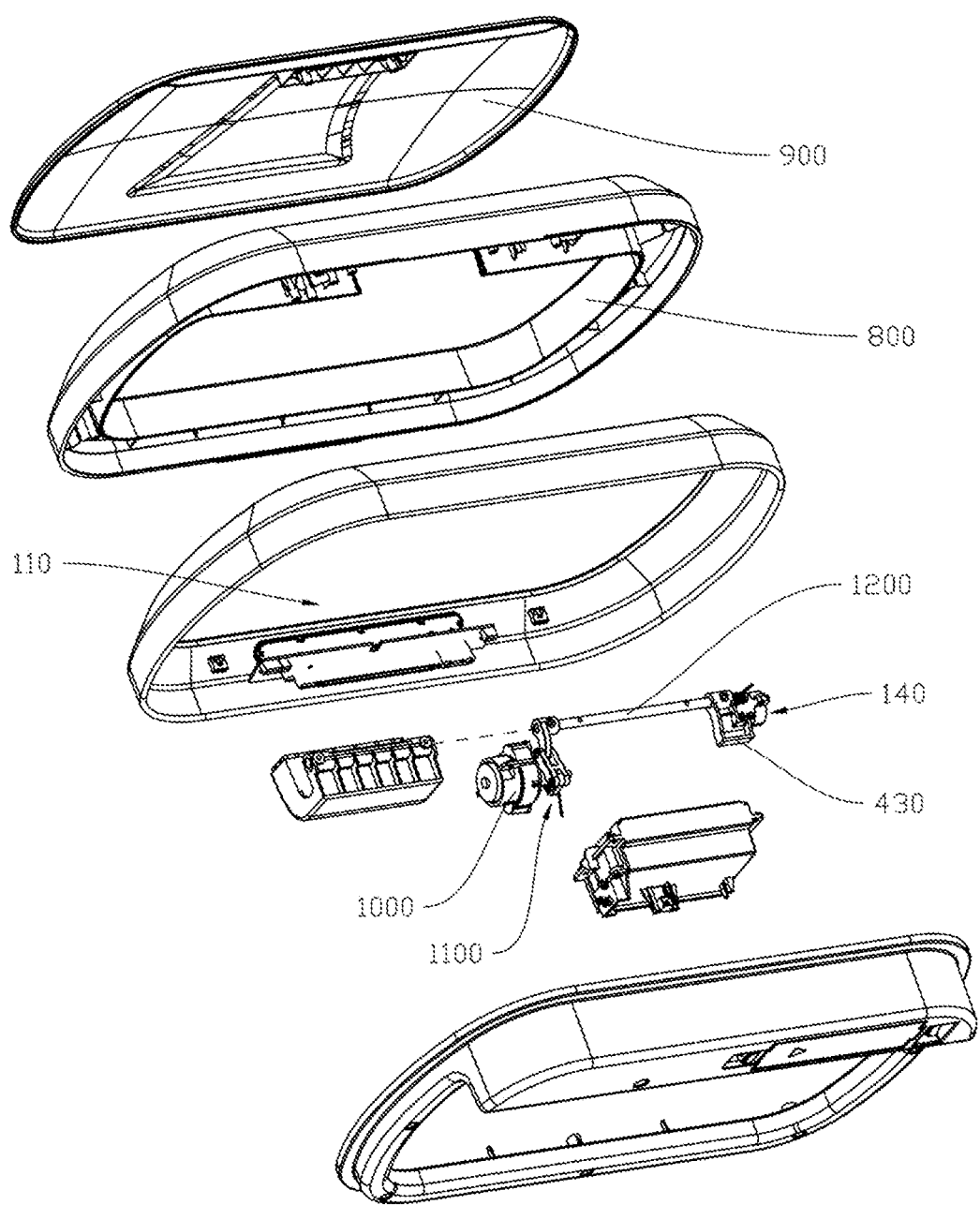
FIG. 4 is an exploded schematic diagram of the can cover having the stabilizing device according to the embodiment of the present disclosure.
Figure 5:
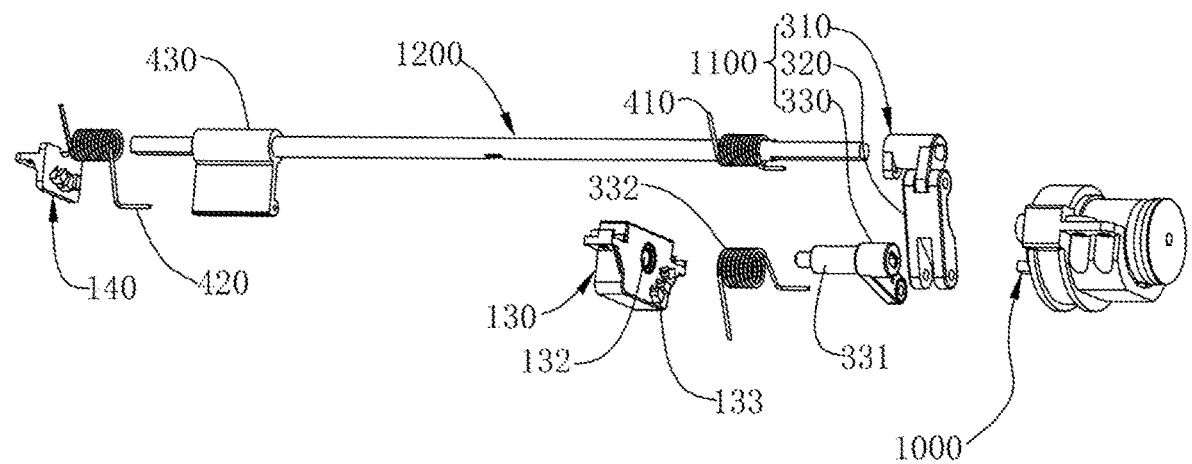
FIG. 5 is an exploded schematic diagram of a buffer of the can cover having the stabilizing device and related components according to the embodiment of the present disclosure.

FIG. 1 to FIG. 2, a current detection circuit of an embodiment according to a first aspect of the present disclosure is used for controlling forward and reverse rotation of a direct current motor 600, comprising: a first switching device 100 for being connected with a first current driving end of the direct current motor 600; a second switching device 200 for being connected with a second current driving end of the direct current motor 600; a third switching device 300 for being connected with the second current driving end of the direct current motor 600; a fourth switching device 400 for being connected with the first current driving end of the direct current motor 600; a control chip 500, wherein the first switching device 100, the second switching device 200, the third switching device 300 and the fourth switching device 400 are all electrically connected with the control chip 500; and a current detection module 700, wherein the second switching device 200 and the third switching device 300 are both connected to a detection input end of the current detection module 700 and the control chip 500 is connected to a detection output end of the current detection module 700; wherein, in response to a first signal sent by the control chip 500, the first switching device 100 and the third switching device 300 are switched on to make the direct current motor 600 rotate forwardly; and in response to a second signal sent by the control chip 500, the second switching device 200 and the fourth switching device 400 are switched on to make the direct current motor 600 rotate reversely.

It should be noted that the first switching device 100, the second switching device 200, the third switching device 300 and the fourth switching device 400 are all controlled by the control chip 500; when the control chip 500 controls the first switching device 100 and the third switching device 300 to be switched on, a current can enter from the first current driving end of the direct current motor 600 and be output from the second current driving end of the direct current motor 600, so that the direct current motor 600 rotates forwardly; when the control chip 500 controls the second switching device 200 and the fourth switching device 400 to be switched on, the current can enter from the second current driving end of the direct current motor 600 and be output from the first current driving end of the direct current motor 600, so that the direct current motor 600 rotates reversely; moreover, the current detection module 700 can also detect a current value during the forward and reverse rotation of the direct current motor 600, so that the control chip 500 can achieve the effect of controlling a miming status of the direct current motor 600 by controlling the first switching device 100, the second switching device 200, the third switching device 300 and the fourth switching device 400 based on the detected current value. Through the foregoing technical solution, by controlling the flow direction of the current and detecting the current, the direct current motor 600 can be conveniently and quickly controlled to rotate forwardly and reversely, so that the control process is simpler and faster.

It should be noted that the control chip 500 is used to control opening and closing statuses of the first switching device 100, the second switching device 200, the third switching device 300 and the fourth switching device 400, and the current detection module 700 is used to detect a current change. A duty ratio of the motor is controlled based on the current change, so that the motor moves in a pulse-like manner. The current change is detected by different states in the movement process to adjust the duty ratio of the motor automatically, so that the movement process becomes stable and the motor can decelerate smoothly.

It should be noted that the control chip 500 may be a singlechip control chip.

It should be noted that the first signal sent by the control chip 500 may be understood as a signal for controlling the first switching device 100 and the third switching device 300 to be switched on; while the second signal output by the control chip 500 may be understood as a signal to control the second switching device 200 and the fourth switching device 400 to be switched on.

It may be understood that the current detection module 700 is connected to a circuit where the direct current motor 600 runs, so that the current detection module can detect the current on the circuit and send a detection signal to the control chip 500. Based on the detection signal, the control chip 500 can also control statuses of the first switching device 100, the second switching device 200, the third Switching device 300 and the fourth switching device 400, so that the Mulling status of the direct current motor 600 can be Controlled.

Referring to FIG. 2, in some specific embodiments of the present disclosure, the first switching device 100 comprises a first P-type field effect transistor Q1, a first triode Q5, a first resistor R1, a fifth resistor R5 and a seventh resistor R7, one end of the seventh resistor R7 is connected with a first control end AI of the control chip 500, the other end of the seventh resistor R7 is connected with a base of the first triode Q5, an emitter of the first triode Q5 is connected with a reference ground, a collector of the first triode Q5 is connected with one end of the fifth resistor R5, the other end of the fifth resistor R5 and one end of the first resistor R1 are both connected with a gate of the first P-type field effect transistor Q1, the other end of the first resistor R1 and a source of the first P-type field effect transistor Q1 are both connected with a positive pole of a power supply, and a drain of the first P-type field effect transistor Q1 is connected with the first current driving end of the direct current motor 600.

It should be noted that the control chip 500 controls the first transistor Q5 to be switched on through the first control end AI, and the first P-type field effect transistor Q1 can be switched on when the first triode Q5 is switched on. After the first P-type field effect transistor Q1 is switched on, the current can flow from the source to the drain of the first P-type field effect transistor Q1 and finally flow from the first current driving end of the direct current motor 600.

It should be noted that the first triode Q5 is a current-type triode, which can be switched on as long as a current input to the base of the first triode Q5 by the control chip 500 exceeds a threshold. The first P-type field effect transistor Q1 is a voltage-type triode, which can be switched on only when a voltage connected to the gate of the first P-type field effect transistor Q1 exceeds a threshold. The control chip 500 can control a current input to the first control end AI to make the first triode Q5 reach different statuses, thus triggering the first P-type field effect transistor Q1 to represent different resistance values. Finally, the current detection module 700 can detect the current when the direct current motor 600 operates.

Referring to FIG. 2, in some specific embodiments of the present disclosure, the third switching device 300 comprises a first N-type field effect transistor Q3 and a fourth resistor R4, a chain of the first N-type field effect transistor Q3 is connected with the second current driving end of the direct current motor 600, one end of the fourth resistor R4 Is connected with a second control end DI of the control chip 500, the other end of the fourth resistor R4 is connected with a gate of the first N-type field effect transistor Q3, and a source of the first N-type field effect transistor Q3 is connected with the reference ground.

It should be noted that the first N-type field effect transistor Q3 is controlled to be switched on through the second control end DI, and the current flows into the drain of the first N-type field effect transistor Q3 through the second current driving end of the direct current motor 600, and then flows from the drain of the first N-type field effect transistor Q3 to the source of the first N-type field effect transistor Q3, thus realizing the forward rotation of the direct current motor 600. The control chip 500 can control a current input to the second control end DI to make the first N-type field effect transistor Q3 reach different statuses, thus triggering the first N-type field effect transistor Q3 to represent different resistance values, so that a impedance of the driving circuit of the direct current motor 600 changes. Finally, the current detection module 700 can detect the current when the direct current motor 600 operates.

Referring to FIG. 2, in some specific embodiments of the present disclosure, the second switching device 200 comprises a second P-type field effect transistor Q2, a second triode Q6, a second resistor R2, a sixth resistor R6 and an eighth resistor R8, one end of the eighth resistor R8 is connected with a third control end CI of the control chip 500, the other end of the eighth resistor R8 is connected with a base of the second triode Q6, an emitter of the second triode Q6 is connected with the reference ground, a collector of the second triode Q6 is connected with one end of the sixth resistor R6, the other end of the sixth resistor R6 and one end of the second resistor R2 are both connected with a gate of the second P-type field effect transistor Q2, the other end of the second resistor R2 and a source of the second P-type field effect transistor Q2 are both connected with the positive pole of the power supply, and a drain of the second P-type field effect transistor Q2 is connected with the second current driving end of the direct current motor 600.

It should be noted that the control chip 500 controls the second triode Q6 to be switched on through the third control end CI, and the second P-type field effect transistor Q2 can be switched on as long as the second triode Q6 is switched on. After the second P-type field effect transistor Q2 is switched on, the current can flow from the source to the drain of the second P-type field effect transistor Q2 and finally flow from the second current driving end of the direct current motor 600. The control chip 500 can control a current input to the third control end CI to make the second triode Q6 reach different statuses, thus triggering the second P-type field effect transistor Q2 to represent different resistance values. Finally, the current detection module 700 can detect the current when the direct current motor 600 operates.

Referring to FIG. 2, in some specific embodiments of the present disclosure, the fourth switching device 400 comprises a second N-type field effect transistor Q4 and a third resistor R3, a drain of the second N-type field effect transistor Q4 is connected with the first current driving end of the direct current motor 600, one end of the third resistor R3 is connected with a fourth control end B1 of the control chip 500, the other end of the third resistor R3 is connected with a gate of the second N-type field effect transistor Q4, and a source of the second N-type field effect transistor Q4 is connected with the reference ground.

It should be noted that the second N-type field effect transistor Q4 is controlled to be switched on through the fourth control end BI, and the current flows into the drain of the second N-type field effect transistor Q4 through the first current driving end of the direct current motor 600, and then flows from the drain of the second N-type field effect transistor Q4 to the source of the second N-type field effect transistor Q4, thus realizing the reverse rotation of the direct current motor 600. In this way, by controlling the flow direction of the current entering the direct current motor 600, the direct current motor 600 can be conveniently and quickly controlled to rotate forwardly or reversely. The control chip 500 can control a current input to the fourth control end BI to make the second N-type field effect transistor Q4 reach different statuses, thus triggering the second N-type field effect transistor Q4 to represent different resistance values, so that a impedance of the driving circuit of the direct current motor 600 changes. Finally, the current detection module 700 can detect the current when the direct current motor 600 operates.

It should be noted that the first P-type field effect transistor Q1 and the first N-type field effect transistor Q3 constitute a circuit in Which the direct current motor 600 operates. The second P-type field effect transistor Q2 and the second N-type field effect transistor Q4 constitute another circuit in which the direct current motor 600 operates. Illustratively, the first P-type field effect transistor Q1 and the first N-type field effect transistor Q3 constitute a forward rotation path of the direct current motor 600. The second P-type field effect transistor Q2 and the second N-type field effect transistor Q4 constitute a reverse rotation path of the direct current motor 600.

Referring to FIG. 2, in some specific embodiments of the present disclosure, the current detection module 700 comprises a ninth resistor R9 and a tenth resistor Res, the source of the first N-type field effect transistor and the source of the second N-type field effect transistor are both connected with one end of the tenth resistor Rcs, one end of the ninth resistor R9 is connected with one end of the tenth resistor Res, the other end of the tenth resistor Rcs is connected with the reference ground, and the other end of the ninth resistor R9 is connected with a current detection end of the control chip 500. The tenth resistor Rcs acts as a voltage divider in the circuit, so that the control chip 500 can detect a voltage value of the tenth resistor Rcs. Since a resistance value of the tenth resistor Rcs is a constant value, the control chip 500 can obtain a current value in the circuit according to the detected voltage value. According to the current value, the control chip 500 can control the statuses of the first P-type field effect transistor Q1, the second P-type field effect transistor Q2, the first N-type field effect transistor Q3 and the second N-type field effect transistor Q4, change the impedance on the circuit, and control the limning status of the direct current motor 600.

In some specific embodiments of the present disclosure, a first magnetic bead L1 is further comprised, wherein one end of the first magnetic bead L1 is connected with the drain of the first P-type field effect transistor Q1, and the other end of the first magnetic bead L1 is connected with the first current driving end of the direct current motor 600. The first magnetic bead L1 is used to suppress high-frequency noise and peak interference on signal lines and power lines, and also has an ability to absorb electrostatic pulses.

In some specific embodiments of the present disclosure, a second magnetic bead L2 is further comprised, wherein one end of the second magnetic bead L2 is connected with the drain of the first N-type field effect transistor Q3, and the other end of the second magnetic bead L2 is connected with the second current driving end of the direct current motor 600. Similarly, the second magnetic bead L2 can also be used to suppress the high-frequency noise and peak interference on the signal lines and power lines, and also has the ability to absorb the electrostatic pulses.

In some specific embodiments of the present disclosure, the current detection module 700 further comprises a first capacitor C1, the other end of the ninth resistor R9 is also connected with one end of the first capacitor C1, and the other end of the first capacitor C1 is connected with the reference ground. The first capacitor C1 can function as a discharge capacitor.

A garbage can of an embodiment according to a second aspect of the present disclosure comprises the current detection circuit above. By using the current detection circuit above, a can cover can be opened and closed conveniently and quickly, so that the control process is simpler and faster.

It may be understood that the current detection circuit provided by the embodiment according to the first aspect of the present disclosure can also be matched with a voltage stabilizing circuit or Hall element, so that the garbage can performs voltage stabilizing treatment when the cover is opened, and the garbage can performs motor duty cycle treatment through current detection when the cover is closed, thus achieving the effect similar to that of a step-down circuit. Based on the above combination, smooth and silent lid opening and uniform closing can be realized, and the instability in a circuit conversion process when the cover is opened by a step-up circuit and then closed by a step-down circuit is avoided. The motor includes but is not limited to chive the garbage cover to move through gears, connecting, rods or direct drive.

It should be noted that the garbage can provided by in this embodiment may include a can cover having a stabilizing device. The can cover comprises a housing, a motor 1000, a buffer 1100, a driving shaft 1200 and a cover plate 900. The housing is provided with, a cover opening 110 for throwing garbage, a first connecting base 130 and a second connecting base 140. The motor 1000 is connected with the housing and fixed on the housing, and is matched with the current detection circuit. A location of the current detection circuit is not limited. A first end of the buffer 1100 is rotatably connected with the first connecting base 130, the first connecting base 130 fixes the buffer 1100 on the housing, the driving shaft of the motor 1000 is connected with the first end of the buffer 1100, and the buffer 1100 rotates under the drive of the motor 1000, One end of the driving shaft 1200 is rotatably connected with the second connecting base 140, and the other end of the driving shaft 1200 is connected with a second end of the buffer 1100. The second connecting base 140 and the buffer 1100 fix the driving shaft 1200 on the housing, and the driving shaft 1200 rotates around an axial direction thereof under the action of the buffer 1100. The cover plate 900 is connected with the driving shaft 1200. The cover plate 900 rotates with the rotation of the driving shaft 1200. When the cover plate 900 moves toward the cover opening 110 and engages with the housing, the cover plate 900 covers the cover opening 110. When the cover plate 900 moves away from the cover opening 110, the cover opening 110 is opened, and objects can be transferred from one side of the housing to the other side of the housing through the cover opening 110. The current detection circuit controls a duty ratio change of the motor to realize a linear change of the current, thus achieving the purpose of opening and closing the cover smoothly. The rotating shaft of the motor 1000 drives the cover plate 900 to rotate through the buffer 1100. The buffer 1100 can increase a torque of the rotating shaft of the motor 1000 and prevent the cover plate 900 from slipping out of the control of the motor 1000 under the action of the gravity or inertia of the cover plate. The buffer 1100 enables the motor 1000 to smoothly control the movement of the cover plate 900. The can cover having the stabilizing device can not only prevent the garbage can from shaking violently due to the too fast or unstable opening speed of the cover plate 900, but also prevent gases in the garbage can from being fanned to an external environment outside the garbage can due to the too fast or unstable closing speed of the cover plate 900.

It should be noted that, in some specific embodiments of the present disclosure, one end of the driving shaft 1200 near the first connecting base 130 is provided with a first torsion spring 410. The first torsion spring 410 is arranged around a circumference of the driving shaft 1200, one end of the first torsion spring 410 abuts against a face shell 800, and the other end of the first torsion spring 410 is connected with a connecting head 310. One end of the driving shaft 1200 near the second connecting base 140 is provided with a second torsion spring 420 and a driving plate 430. The driving plate 430 is connected with a side wall of the driving shaft 1200, the second torsion spring 420 is arranged around the circumference of the driving shaft 1200, one end of the second torsion spring 420 abuts against the face shell 800, and the other end of the second torsion spring 420 is connected with the driving plate 430. When the cover plate 900 moves away from the cover opening 110, the first torsion spring 410 and the second torsion spring 420 are twisted and elastically deformed, generating an acting force towards the cover opening 110 on the cover plate 900, and buffering a torque generated by the motor 1000 on the driving shaft 1200, preventing the cover plate 900 from being lifted up rapidly to cause the garbage can shake when the motor 1000 is suddenly started, and ensuring the smooth movement of the cover plate. When a power supply of the driving circuit 1300 is switched off, the cover plate 900 moves away from the cover opening 110 manually. The first torsion spring 410 and the second torsion spring 420 exert an acting force on the cover plate 900 to move the cover plate 900 towards the cover opening 110. The cover plate 900 can automatically move towards the cover opening 110 and be attached to the face shell, thus preventing the garbage in the garbage can from polluting the environment outside the garbage can. After a user opens the cover plate 900, there is no need to manually close the cover plate 900, which is easy to operate and can effectively improve the user experience. The first torsion spring 410 and the second torsion spring 420 are respectively arranged at both ends of the driving shaft 1200. The acting forces of the first torsion spring 410 and the second torsion spring 420 on the driving shaft 1200 through the connecting head 310 and the driving plate 430 are distributed at both ends of the driving shaft 1200, so that the force borne by the driving shaft 1200 is uniform and the cover plate 900 can move smoothly.

It is worth noting that in some specific embodiments of the present disclosure, a joint pin 331 may also be provided with a third torsion spring 332. The third torsion spring 332 is arranged around a circumference of the joint pin 331, and the first connecting base 130 is provided with a plurality of clamping grooves 133. One end of the third torsion spring 332 abuts against the clamping grooves 133, and the other end of the third torsion spring 332 is connected with a second connecting arm 330. The third torsion spring 332 plays a role of assisting the buffer 1100 to support the cover plate 900. When the cover plate 900 moves towards the face shell 800, the first connecting base 130 and a second connecting arm 330 elastically deform the third torsion spring 332. The third torsion spring 332 generates an auxiliary force on the cover plate 900 to make the cover plate 900 move away from the face shell 800, thus preventing the cover plate 900 from being affected by the rotating shaft of the motor 1000 under the gravity or inertia thereof, so that the moving stability of the cover plate 900 is improved. The clamping grooves 133 are arranged around a circumferential direction of a connecting hole 132. By connecting the third torsion spring 332 to different clamping grooves 133, the auxiliary force generated by the third torsion spring 332 on the cover plate 900 can be adjusted.

Figure 6:
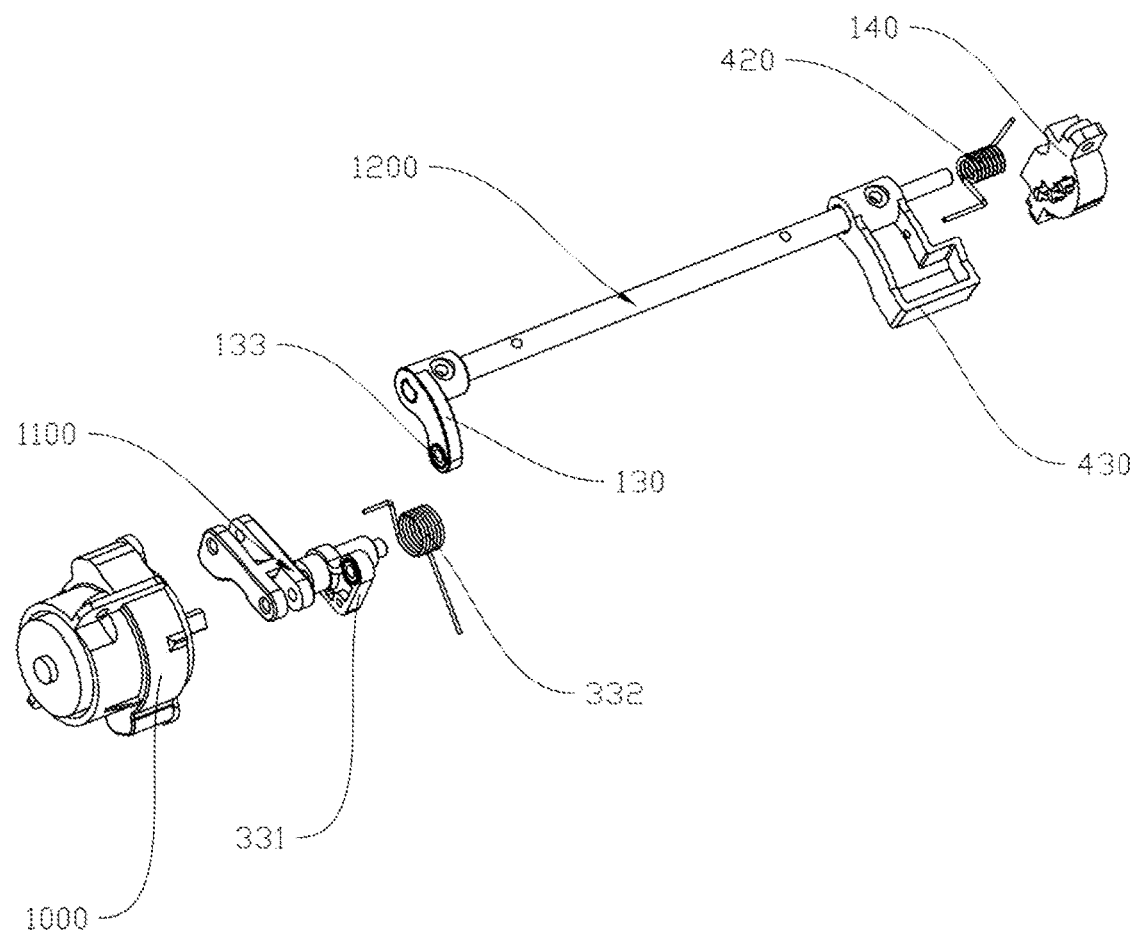
FIG. 6 is an exploded schematic diagram of another buffer of a can cover having a stabilizing device and related components according to the embodiment of the present disclosure.

It should be noted that in some specific embodiments of the present disclosure, the structure of the stabilizing device is not limited to arranging the torsion springs on both ends of the single driving shaft 1200 according to the above-mentioned embodiments, and the torsion springs can also be arranged on different driving shafts 1200, i.e., separate design is employed on the torsion springs. Alternatively, the torsion spring is arranged on one end of the driving shaft 1200 only; alternatively, any one of the three springs in the stabilizing device according to the foregoing embodiment is arranged only. According to the design requirements of different products, spring clamping positions in the stabilizing device are provided with clamping grooves of different gear positions for adjustment. For example, FIG. 6 illustrates an exploded schematic diagram of a buffer of the can cover having a stabilizing device and related components of a waterproof structure designed for use with the buffer according to another embodiment. It should be noted that, in some specific embodiments of the present disclosure, the transmission mode is not limited to the above link-type transmission mode, but also may be direct driving or gear transmission. This embodiment also shows the housing structure design of the core rotating part with waterproof properties.

In the descriptions of the specification, the descriptions with reference to the terms "one embodiment", "some embodiments", "illustrative embodiment", "example", "specific example" or "some examples", and the like, refer to that specific features, structures, materials, or characteristics described with reference to the embodiments or examples are included in at least one embodiment or example of the present disclosure. In the specification, the schematic representation of the above tens does not necessarily mean the same embodiment or example. Moreover, the specific features, structures, materials or characteristics described may be combined in any one or more embodiments or examples in a suitable manner.

Although the embodiments of the present disclosure have been shown and described, those of ordinary skills in the art should understand that: various changes, amendments, substitutions and modifications can be made to these embodiments without departing from the principles and purposes of the present disclosure, and the scope of the present disclosure is limited by the claims and equivalents thereof.

What is claimed is:

1. A current detection circuit for controlling forward and reverse rotation of a direct current motor, comprising:
   a first switching device for being connected with a first current driving end of the direct current motor;
   a second switching device for being connected with a second current driving end of the direct current motor;
   a third switching device for being connected with the second current driving end of the direct current motor;
   a fourth switching device for being connected with the first current driving end of the direct current motor;
   a control chip, wherein the first switching device, the second switching device, the third switching device and the fourth switching device are all electrically connected with the control chip; and
   a current detection module, wherein the second switching device and the third switching device are both connected to a detection input end of the current detection module, and the control chip is connected to a detection output end of the current detection module;
   wherein, in response to a first signal sent by the control chip, the first switching device and the third switching device are switched on to make the direct current motor rotate forwardly; and in response to a second signal sent by the control chip, the second switching device and the fourth switching device are switched on to make the direct current motor rotate reversely, and
   wherein the first switching device comprises a first P-type field effect transistor, a first triode, a first resistor, a fifth resistor and a seventh resistor, one end of the seventh resistor is connected with a first control end of the control chip, the other end of the seventh resistor is connected with a base of the first triode, an emitter of the first triode is connected with a reference ground, a collector of the first triode is connected with one end of the fifth resistor, the other end of the fifth resistor and one end of the first resistor are both connected with a gate of the first P-type field effect transistor, the other end of the first resistor and a source of the first P-type field effect transistor are both connected with a positive pole of a power supply, and a drain of the first P-type field effect transistor is connected with the first current driving end of the direct current motor.

2. The current detection circuit of claim 1, wherein the third switching device comprises a first N-type field effect transistor and a fourth resistor, a drain of the first N-type field effect transistor is connected with the second current driving end of the direct current motor, one end of the fourth resistor is connected with a second control end of the control chip, the other end of the fourth resistor is connected with a gate of the first N-type field effect transistor, and a source of the first N-type field effect transistor is connected with the reference ground.

3. The current detection circuit of claim 2, wherein the second switching device comprises a second P-type field effect transistor, a second triode, a second resistor, a sixth resistor and an eighth resistor, one end of the eighth resistor is connected with a third control end of the control chip, the other end of the eighth resistor is connected with a base of the second triode, an emitter of the second triode is connected with the reference ground, a collector of the second triode is connected with one end of the sixth resistor, the other end of the sixth resistor and one end of the second resistor are both connected with a gate of the second P-type field effect transistor, the other end of the second resistor and a source of the second P-type field effect transistor are both connected with the positive pole of the power supply, and a drain of the second P-type field effect transistor is connected with the second current driving end of the direct current motor.

4. The current detection circuit of claim 3, wherein the fourth switching device comprises a second N-type field effect transistor and a third resistor, a drain of the second N-type field effect transistor is connected with the first current driving end of the direct current motor, one end of the third resistor is connected with a fourth control end of the control chip, the other end of the third resistor is connected with a gate of the second N-type field effect transistor, and a source of the second N-type field effect transistor is connected with the reference ground.

5. The current detection circuit of claim 4, wherein the current detection module comprises a ninth resistor and a tenth resistor, the source of the first N-type field effect transistor and the source of the second N-type field effect transistor are both connected with one end of the tenth resistor, one end of the ninth resistor is connected with one end of the tenth resistor, the other end of the tenth resistor is connected with the reference ground, and the other end of the ninth resistor is connected with a current detection end of the control chip.

6. The current detection circuit of claim 1, further comprising a first magnetic bead, wherein one end of the first magnetic bead is connected with the drain of the first P-type field effect transistor, and the other end of the first magnetic bead is connected with the first current driving end of the direct current motor.

7. The current detection circuit of claim 2, further comprising a second magnetic bead, wherein one end of the second magnetic bead is connected with the drain of the first N-type field effect transistor, and the other end of the second magnetic bead is connected with the second current driving end of the direct current motor.

8. The current detection circuit of claim 5, wherein the current detection module further comprises a first capacitor, the other end of the ninth resistor is connected with one end of the first capacitor, and the other end of the first capacitor is connected with the reference ground.

9. A garbage can, comprising the current detection circuit of claim 1.

* * * * *